United States Patent [19]
Cota et al.

[11] Patent Number: 5,705,989
[45] Date of Patent: Jan. 6, 1998

[54] CURRENT STATUS CIRCUIT FOR A VARIABLE FREQUENCY MOTOR

[75] Inventors: Roger S. Cota, Vancouver, Wash.; Kent J. Holce, Lake Oswego, Oreg.

[73] Assignee: Veris Industries, Inc., Portland, Oreg.

[21] Appl. No.: 684,465

[22] Filed: Jul. 19, 1996

[51] Int. Cl.$^6$ .................................................. G08B 21/00
[52] U.S. Cl. ..................... 340/660; 340/658; 340/664; 364/495; 324/127; 324/129
[58] Field of Search ........................... 340/660, 648, 340/669, 658; 364/578, 495; 361/84, 774, 76.39; 324/111, 220, 127; 342/119, 129

[56] References Cited

U.S. PATENT DOCUMENTS

| | | | |
|---|---|---|---|
| 3,584,294 | 6/1971 | Siwko | 405/230 |
| 4,215,278 | 7/1980 | Barbier et al. | 307/116 |
| 4,621,532 | 11/1986 | Takagi et al. | 73/623 |
| 4,757,416 | 7/1988 | Wilkerson | 361/84 |
| 4,926,105 | 5/1990 | Mischenko et al. | 318/800 |
| 5,502,374 | 3/1996 | Cota | 324/127 |
| 5,596,652 | 1/1997 | Piatek et al. | 382/115 |

*Primary Examiner*—Jeffery Hofsass
*Assistant Examiner*—Davetta Woods
*Attorney, Agent, or Firm*—Chernoff, Vilhauer, McClung & Stenzel

[57] ABSTRACT

A sensor linked with a power cable to produce a first signal in response to the presence of at least one of a sensed current and a sensed voltage within the power cable. The measuring circuit is electrically connected to the sensor to produce a second signal in response to the first signal representative of the magnitude of at least one of the sensed current and the sensed voltage within the power cable. The measuring circuit also produces a third signal in response to the first signal representative of a sensed frequency of at least one of the sensed current and the sensed voltage within the power cable. The measuring circuit includes a model of a set of predetermined relationships between a plurality of reference frequencies and a reference amplitude for each of the reference frequencies for at least one of the sensed voltage and the sensed current of the power cable. The measuring circuit compares the second signal and the third signal to the model to produce a resultant signal indicative of an alarm condition. By including the frequency of the sensed signal in the determination of whether the motor is operating properly, accurate determination of alarm conditions can be made.

7 Claims, 4 Drawing Sheets

CURRENT STATUS CIRCUIT FOR A VARIABLE FREQUENCY MOTOR

BACKGROUND OF THE INVENTION

The present invention relates to a sensor and measuring circuit suitable for indicating an alarm condition for a variable frequency motor.

Traditionally, motors and pumps operate using an electrical power source that has a constant frequency, such as 50 or 60 hertz. In an air conditioning system the motor may be coupled with a belt to a fan in order to circulate air through duct work in a building. To remotely determine if the motor, belt, and fan are operating properly, one or more pressure transducers are mounted in the duct work to sense the air pressure. If the motor stops running, the belt breaks, or the fan breaks, then the air pressure within the duct work will decrease. The pressure transducers sense the decrease in the air pressure and trigger an alarm condition. The same principle is applicable for motors connected to conveyor systems that use tachometers, as opposed to pressure transducers, to monitor the operation of the conveyor system.

Pressure transducers and tachometers need to be manually adjusted when installed to set a threshold level below which an alarm condition is indicated. An alarm condition, as used hereafter, refers to an indication that the electrical system is not operating within a set of predefined parameters, normally indicative of a system failure. Manual adjustment of the threshold level is time-consuming and prone to error. Also, because pressure transducers are susceptible to accumulating dust and dirt, their reliability is suspect, and so they require periodic maintenance. Further, pressure transducers are expensive and require a power source to operate.

An alternative approach to using pressure transducers is a current sensor that senses the current level within a power cable to the motor. The sensed current level is used to determine whether the motor, belt, and fan are operating properly. If the motor stops operating or the belt breaks, then the current level to the motor will drop significantly. The current sensor detects the decrease in the current level and indicates an alarm condition if the current level drops below a predetermined threshold level. However, many motors use a variable frequency drive which allows accurate control over the operation of the motor by supplying a variable frequency signal and a variable voltage level to the motor. Variable frequency drives also attempt to select the operating point of the motor to minimize the electrical power used. However, the aforementioned current sensors frequently trigger false alarms when used with motors that include a variable frequency drive.

What is desired, therefore, is a current sensor that accurately determines alarm conditions for motors that include a variable frequency drive.

SUMMARY OF THE PRESENT INVENTION

The present invention overcomes the aforementioned drawbacks of the prior art by providing a measuring system with a sensor linked with a power cable to produce a first signal in response to the presence of at least one of a sensed current and a sensed voltage within the power cable. A measuring circuit included in the measuring system is electrically connected to the sensor to produce a second signal, in response to the first signal, which is representative of the magnitude of at least one of the sensed current and the sensed voltage within the power cable. The measuring circuit also produces a third signal, also in response to the first signal, representative of a sensed frequency of at least one of the sensed current and the sensed voltage within the power cable. The measuring circuit includes a model of predetermined relationships between a plurality of reference frequencies and a reference amplitude for each of the reference frequencies for at least one of the sensed voltage and the sensed current of the power cable. The measuring circuit compares the second signal and the third signal to the model to produce a resultant signal indicative of an alarm condition. By including the frequency of the sensed signal in the determination of whether the motor is operating properly, accurate determination of alarm conditions can be made.

In a preferred embodiment, the measuring circuit automatically learns a model of the amplitude of the current level at different frequencies. The model is then periodically updated to reflect the present operating conditions of the motor. In order to update the model the system uses three conditions which are particularly suitable for an air conditioning system. The first condition is that the system will not change the model if an alarm condition is currently indicated. The second condition is that the system will only update the model with the newly sensed current value if the newly sensed current value is greater than the existing current value in the model. The third condition is that the system will not automatically replace existing current values which are greater than the newly sensed current value. With regard to the third condition, the system replaces existing current values with the newly sensed current value only if the newly sensed current value is less than a predetermined percentage change of the existing current value. Automatically learning the model and periodically updating the model by applying a set of criteria permits the measuring system to adapt to a dynamic system.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
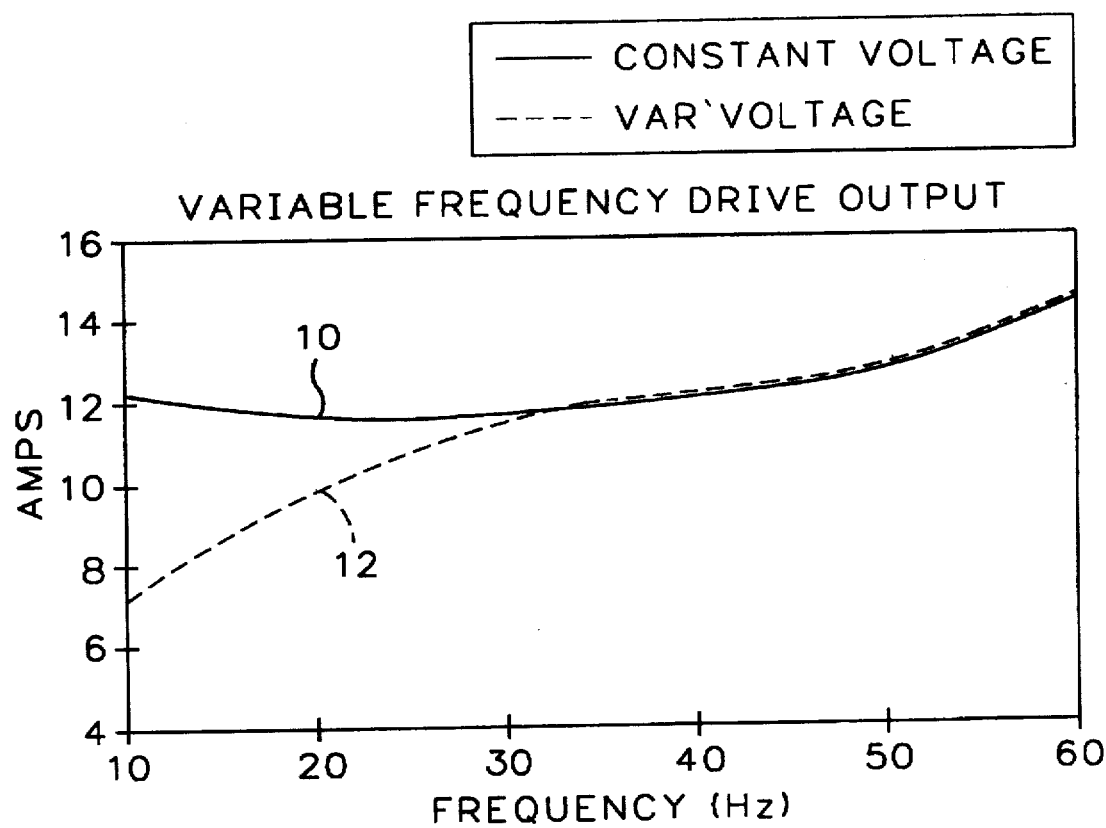
FIG. 1 is a graph of the current versus frequency for the output of a variable frequency drive for a motor operating at a constant speed and load.

Referring to FIG. 1, a variable frequency drive normally supplies a variable frequency output signal that has both a variable voltage amplitude and a variable frequency to optimally operate a motor with a given load. Line 10, which is slightly U-shaped, shows the frequency versus the current level supplied to the motor when the voltage supplied to the motor is held constant. Line 12 shows the frequency versus the current level supplied to the motor when both the voltage level and frequency are varied. Line 12 illustrates that at lower frequencies the current level is substantially decreased while the motor is properly operating. This characteristic of variable frequency drives, namely the substantial variability in the current level, triggers false alarms when used in conjunction with traditional single frequency current sensors. After considering the actual operation of variable frequency drives as illustrated in FIG. 1, the present inventor came to the realization that simply sensing the current level is insufficient to accurately diagnose an alarm condition.

For example, to decrease the motor's speed, the frequency and current level of the signal supplied to the motor are decreased. However, simply detecting a threshold level cannot distinguish between a change in the motor's current level as a result of the variable frequency drive controller and a change in the current level as a result of load variations, such as a broken belt. In either case the current sensor simply senses that the current level is below a threshold level and indicates each as a fault condition, albeit incorrectly in one case. Accordingly, a current sensor suitable for a variable frequency drive should consider the voltage or current levels within a power cable in combination with its frequency to indicate an alarm condition.

Figure 2:
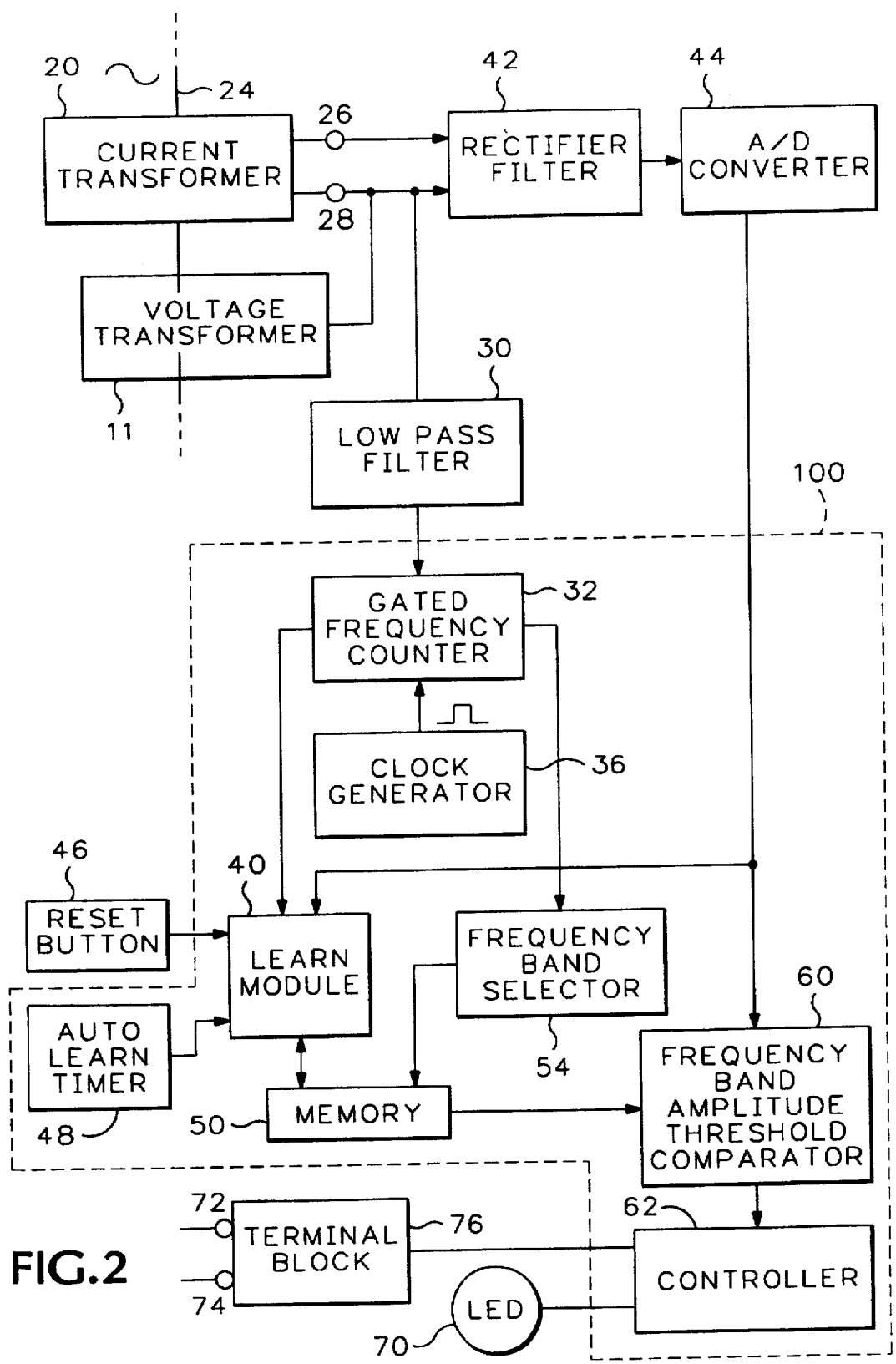
FIG. 2 is a block diagram of the measuring system of the present invention.

Referring to FIG. 2, a current transformer 20 senses alternating current within a power cable 24 supplying electric power to the motor (not shown). Other electrical devices, such as a pump, may be used instead of the motor. The transformer 20 is preferably a wire wrapped toroidal core surrounding the power cable 24 and generates an output voltage signal at its terminals 26 and 28 that is proportional to the current in the power cable 24. The toroidal core may be an iron core or an air core (a non-magnetically permeable material). A suitable core is disclosed in U.S. Pat. No. 5,502,374, assigned to the same assignee and incorporated herein by reference. Alternately, a voltage transformer 11 that physically taps the power cable 24 may be used.

Variable frequency drive controllers for variable frequency motors incorporate the use of a carrier signal, generally around 2000 hertz, which is modulated in order to generate relatively low frequency signals to operate the motor, such as between 0 and 100 hertz. Modulation of the carrier signal generates significant noise and other stray signals that could interfere with accurate sensing of the primary drive signal to the motor. Also, the current transformer 20 generates harmonics of the drive signal; for example, a 60 hertz drive signal would generate 120 hertz, 180 hertz, 240 hertz, etc., harmonics. To remove the stray signals, noise, and harmonics to obtain a signal representative of only the primary drive signal, the output voltage signal at the terminals 26 and 28 of the current transformer 20 is filtered by a low pass filter 30. The low pass filter 30 has one pole with a breakoff frequency of 70 hertz. However, the breakoff frequency and number of poles can be changed, as desired.

To determine the frequency of the signal in the power cable 24, the rising edges of the signal are counted over a specific time period. A gated frequency counter 32 is triggered each second by a clock signal from a clock generator 36. The frequency counter 32 is reset to zero upon receiving each clock signal from the clock generator 36. The frequency counter 32 counts each rising edge of the signal from the filter 30 until receiving the next clock signal from the clock generator 36. The total number of rising edges detected between successive clock signals is stored in a storage register within the counter 32. The frequency counter 32 is reset to zero by the clock signal and begins to count the number of rising edges during the next second. The total number of rising edges counted during the one second interval between clock signals is the frequency of the signal in the power cable 24. Alternatively, both the rising and falling edges may be counted to determine the frequency. Other frequency detection methods may be used such as zero crossings, peak detection, etc. The value in the storage register of the frequency counter 32 is representative of the frequency of the signal in the power cable.

A model of the operating characteristics of the motor, such as the current or voltage level at different frequencies, needs to be determined so that a set of threshold values can be determined depending upon the operating point of the motor. To automatically determine the threshold value for different frequencies, the current sensor includes two modes, namely, an operating mode and a learn mode. In the learn mode, the operating characteristics of the particular motor are determined. While operating in the learn mode, the frequency counter 32 passes the frequency value stored in its storage register representative of the signal's frequency to the learn module 40. The learn module 40 also receives an amplitude value representative of the amplitude of the current in the power cable 24, as described below. The storage register and the software to perform many of the calculations is located in the microcontroller 100, described later.

A rectifier filter 42 receives and rectifies the output voltage signal from the terminals 26 and 28 to produce a DC output signal. In addition, the rectifier filter 42 also filters out any slow time variations of the current in the power cable (described later). The DC output signal from the rectifier filter 42 is received by an analog-to-digital (A/D) converter 44 which converts the DC signal from the rectifier filter 42 to a digital value representative of the amplitude of the current in the power cable 24. The A/D converter 44 also averages the amplitude of the digital value over time to eliminate transients or other erroneous signals which could result in erroneous data. The time averaging of the amplitude also decreases the effects of noise. The A/D converter 44 preferably averages 10 samples. Alternatively, one or more root-mean-square samples could be used. The long term average of the amplitude from the A/D converter 44 is the aforementioned amplitude input to the learn module 40. The learn module 40 correlates each frequency value with the associated amplitude value to create a model which defines the operating characteristics of the motor over a range of frequencies.

One method to initiate the learn mode is with a reset button 46 which resets all of the values of the model to an initial value, such as zero. Another method of initiating the learn mode is by the auto learn timer 48. The timer 48 periodically initiates the learn mode in order to update the model of the motor's operating characteristics to account for current operating characteristics of the system. This allows dynamic systems to be monitored by periodically updating the model of the motor to reflect load changes on the motor. For example, the auto learn timer 48 may initiate the learn mode every twenty minutes, and if a certain set of criteria are met, learn the new operating point of the motor.

Figure 3:
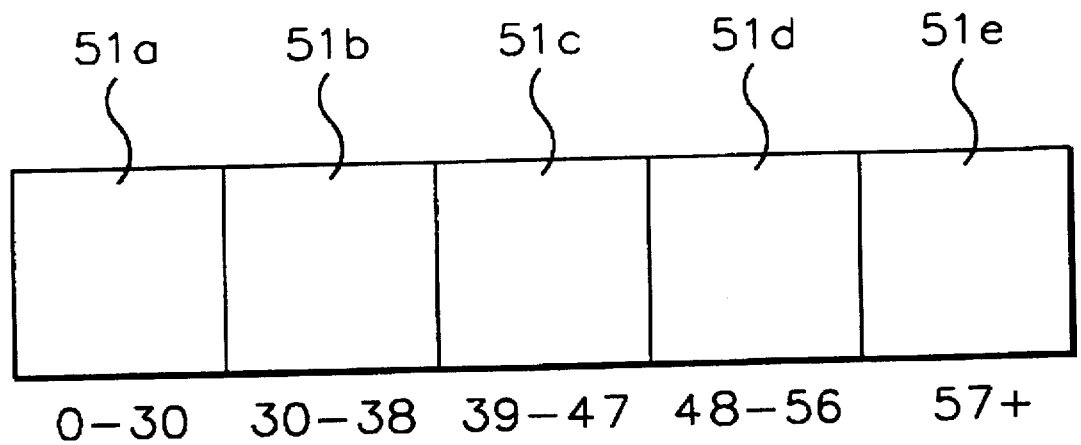
FIG. 3 is a block diagram which illustrates five frequency bands for the measuring system of FIG. 2.

Also referring to FIG. 3, five frequency bands 51a–51e are stored in memory 50 to correlate the different frequencies and amplitudes detected by the sensor for the model of the operating characteristics of the motor. The frequency bands 51a–51e are preferably 0–30 Hz, 31–38 Hz, 39–47 Hz, 48–56 Hz, and 57 Hz and up. The frequency bands are selected to concentrate the bands where the motor usually operates. For example, any frequency detected in the range of 48 to 56 hertz will have its associated amplitude value stores in band 51d. The number and range of frequency bands may be changed, as desired.

A set of conditions must be satisfied before storing an amplitude value to one of the frequency bands (which is one embodiment of the model) in order to avoid inadvertently learning that an alarm condition is a valid operating point. There are three such conditions for a motor-belt-fan system. The first condition is that the system will not learn, e.g. change the value stored in the frequency band, if an alarm condition is currently indicated. The second condition is that the system will only update (replace) the existing amplitude value in the frequency band with the newly sensed amplitude value if the newly sensed amplitude value is greater than the existing amplitude value. The second condition is necessary because an increased load on a motor-belt-fan system is normally the result of moving a greater amount of air to increase cooling and is not indicative of an alarm condition. For example, during summer, the current drawn by the motor increases as use of the air conditioner is increased. Typical fault conditions includes a broken motor, stuck belt, or broken fan, all of which result in a lower current level. One possible fault is that the fan will freeze in place thus increasing the load current. However, the belt will burn up shortly thereafter which removes the load from the motor, and thus the load current will significantly decrease. The third condition is that the system will not automatically replace existing amplitude values which are greater than the newly sensed amplitude value. With regard to the third condition, the system only replaces existing amplitude values with the newly sensed amplitude value if the newly sensed amplitude value is less than a predetermined percentage change of the existing amplitude value, such as 10 percent lower. This permits the system to accommodate seasonal changes in the use of the motor, such as decreased use of air conditioning during cooler months. The percentage decrease requirement discriminates against indicating a failure condition (also referred to as an alarm condition) which normally is an abrupt significant decrease in the current level.

The use of the aforementioned criteria for updating the frequency bands allows for automatic modification of the learned model of operating characteristics to accommodate seasonal or periodic changes in the use of the motor. Also, when the sensor is reset, all the frequency bands are set to zero. With the ability for unbounded increases in the value stored in each of the frequency bands (the second condition), the system will learn up to the normal operating conditions which may be a significant change from zero.

Alternatively, in some systems the alarm (fault) condition could be indicated by a high current level. In this case, the first condition would remain the same. The second condition would be changed to only update the existing amplitude value in the frequency band with the newly sensed amplitude value if the newly sensed amplitude value is less than the existing amplitude value. The third condition would be changed to only replace an existing amplitude value that is less than the newly sensed value only if the newly sensed value is greater than a predetermined percentage change of the existing amplitude value. As an example, if the existing value was 100 and the percentage change was set to 10%, then the newly sensed value would need to be greater than 110 before the existing value of 100 was replaced with the newly sensed value. In this system configuration the frequency bands should be reset to a large number to accommodate automatic learning down to the amplitude of the current levels.

In the learn mode, the system checks to see that the frequency during a predetermined time period, such as 90 seconds, has maintained values within a single frequency band in order to assure that the associated amplitude value is for steady state operation of the motor. This check is performed by the microcontroller 100. This avoids abnormal amplitude values associated with transient conditions, such as ramping the motor (increase or decrease of the speed of the motor). Also, this avoids saving an amplitude value for a particular frequency band when the frequency values moves between one frequency band and another frequency band.

Figure 4:
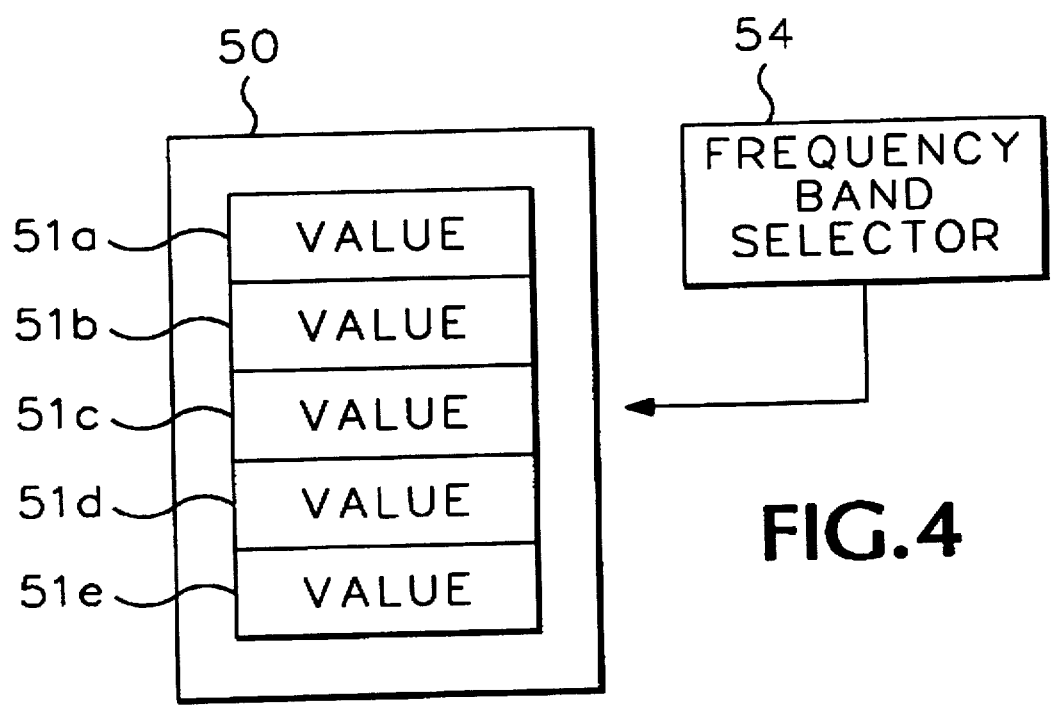
FIG. 4 is a block diagram which illustrates a memory where the first frequency bands of FIG. 3 are stored and a frequency band selector.

Referring to FIG. 4, the system uses a 16-bit field address for each of the five frequency bands 51a–51e in the memory 50. The value stored in each field is the amplitude of the current corresponding to the particular frequency range. Alternatively, the frequency and amplitude could be stored, if desired.

In summary, the learn mode determines what frequency band the signal is in. The memory address for that frequency is determined and the existing amplitude value is read from memory 50. Next, the three conditions and the required duration of a constant frequency (within one frequency band) are applied to the existing amplitude value and newly sensed amplitude value to determine if the existing amplitude value should be changed. If the existing amplitude value should be changed then newly sensed amplitude value is stored in the memory 50 at the appropriate location.

In the operating mode, the frequency counter 32 passes the frequency stored in its register to the frequency band selector 54. The selector 54 determines both the frequency band and the memory address in the memory 50 to indicate the appropriate existing amplitude value.

The Frequency Band Amplitude Threshold Comparator 60 fetches the amplitude value from the memory location (16-bit address field) indicated by the selector 54. The amplitude value from memory 50 is compared to the amplitude value from the A/D converter 44. If the amplitude value from the A/D converter 44 is greater than or equal to the amplitude value from the memory 50, then the motor system is operating properly. This condition is indicative of no change in the load or an increase in the load which is not normally indicative of an alarm condition. If the amplitude value from the memory 50 is less than a preselected percentage of the amplitude value from the A/D converter 44, then an alarm condition is indicated. This condition is indicative of a sharp drop in the current level which normally indicates an alarm condition. The percentage for the threshold is preferably set to 25 percent, although other values may be used. Alternatively, if the particular system indicates an alarm condition when the current level increases significantly, then the alarm condition is indicated when the amplitude value from the memory 50 is greater than a preselected percentage of the amplitude value from the A/D converter 44.

In an air conditioning system, a variable speed drive is connected to a motor which in turn is connected to a fan. However, the present inventor has realized that air in the duct system normally oscillates at a slow rate, such as 0.3 to 0.1 cycles per second as a result of a resonant system from disturbances, such as opening or closing a door. The resonance changes the load on the fan, which is in turn reflected as a change in the current level drawn by the motor. Therefore, the current level to a properly operating motor normally bounces within a limited range as a result of the resonance. The threshold value (percentage difference used to determine an alarm condition) should be set to a value greater than the percentage change in the fluctuations that result from oscillations so that normal fluctuations are not indicated as an alarm condition. For example, a motor with a current level of 100 amps may have a plus or minus 10 amp fluctuation due to oscillations. A broken belt is typically indicated by a substantial drop in the current level, such as around 50 percent. The present system uses a percentage drop of 25 percent, as previously mentioned, to indicate an alarm condition because it is greater than the normal variations but less than that of a fault. The percentage drop can be changed as desired. The rectifier filter 42 reduces the effects of these fluctuations, as previously mentioned. In addition, the long-term averaging by the converter 44 reduces the effects of the oscillations.

Alternatively, the model could be a predetermined functional relationship for the particular motor that is compared with the sensed amplitude value and frequency value. The function would be preferably defined by the microcontroller 100 or by other suitable methods. In essence, the model could be any defined relationship between an amplitude value (voltage or current) and its frequency.

If an alarm condition is indicated, then an alarm signal is passed to a controller 62. The controller 62 requires two successive alarm indications from the comparator 60 before actually indicating an alarm or fault to a motor control center (not shown). Two successive alarm signals avoids spurious alarms resulting from spikes and glitches in the software and the hardware. In addition, the controller 62 also requires, for security sake, a fault to be indicated for a set period of time, such as 15 seconds to 2 minutes, before an alarm is indicated. If two or more successive alarms over a set time period are received then the LED 70 provides a visual indication that an alarm has occurred. For example, an alarm may be indicated by blinking the LED 70 at a different rate. In addition, the output terminals 72 and 74 of a terminal block 76 are used to indicate alarm conditions to the motor control center. For example, the output terminals 72 and 74 are closed (short circuit) during normal operation. The terminals 72 and 74 are opened (open circuit) to indicate an alarm condition.

Figure 5:
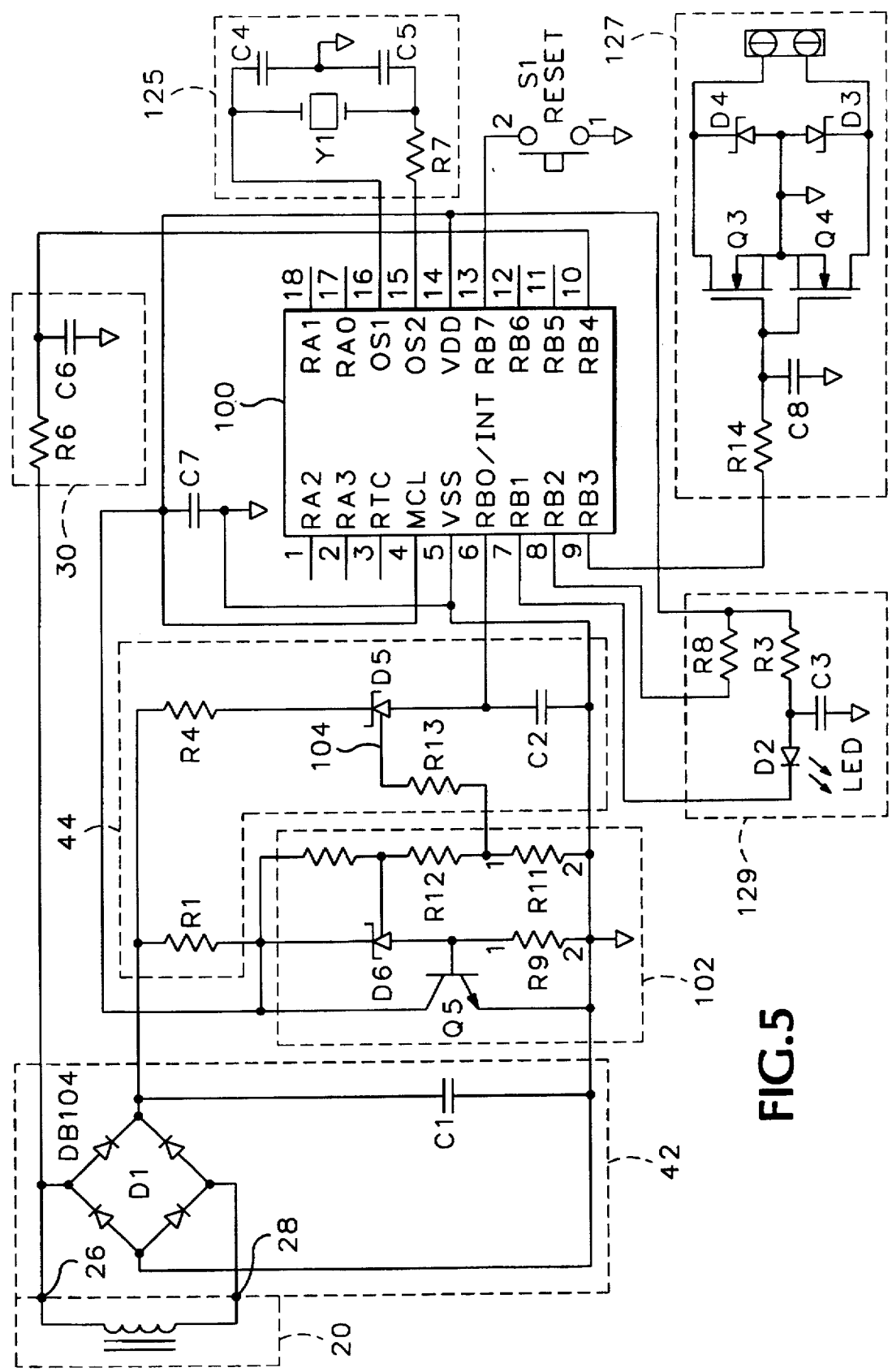
FIG. 5 is an electrical schematic of the measuring system shown in FIG. 2.

Referring to FIG. 5, the terminals 26 and 28 of the current transformer 20 are connected to a full wave rectifier filter 42. The voltage signal from the rectifier filter 42 is used to supply power to the electronics within the current sensor to alleviate the need for routing a power cable to the electronics. A microcontroller 100 requires a 4-volt power source to operate. The output of the transformer 20 may have a voltage between 0 and 50 volts or more which needs to be rectified in order to power the microcontroller 100 using the energy supplied from the power cable 24. A shunt regulator circuit 102 is used to transform the DC voltage value from the rectifier filter 42 to the 4-volt signal to power the microcontroller 100.

The A/D converter 44 is a single slope A/D converter which converts the voltage input on line 104 to a charging current in a capacitor C2. The microcontroller 100 measures the time for the capacitor C2 to charge to a known value. The result is that the higher the input voltage, the faster the capacitor charges. In operation, the capacitor C2 is shorted and a counter is set to zero within the microcontroller 100. Then the capacitor C2 is unshorted and the counter counts. When the voltage across the capacitor C2 reaches a threshold value the counter is halted and the value in the counter is inversely proportional to the input voltage, which is in turn proportional to the current. The counter value is an indication of the current value. For example, 3 amps would be indicated by a relatively large value and 100 amps would be indicated by a relatively small value. The microcontroller 100 converts the counter's value to a value directly proportional to the current level. Block 125 is a clock generator for the microcontroller 100. Block 127 is the terminal block 76, and block 129 is the LED 70.

Figure 6:
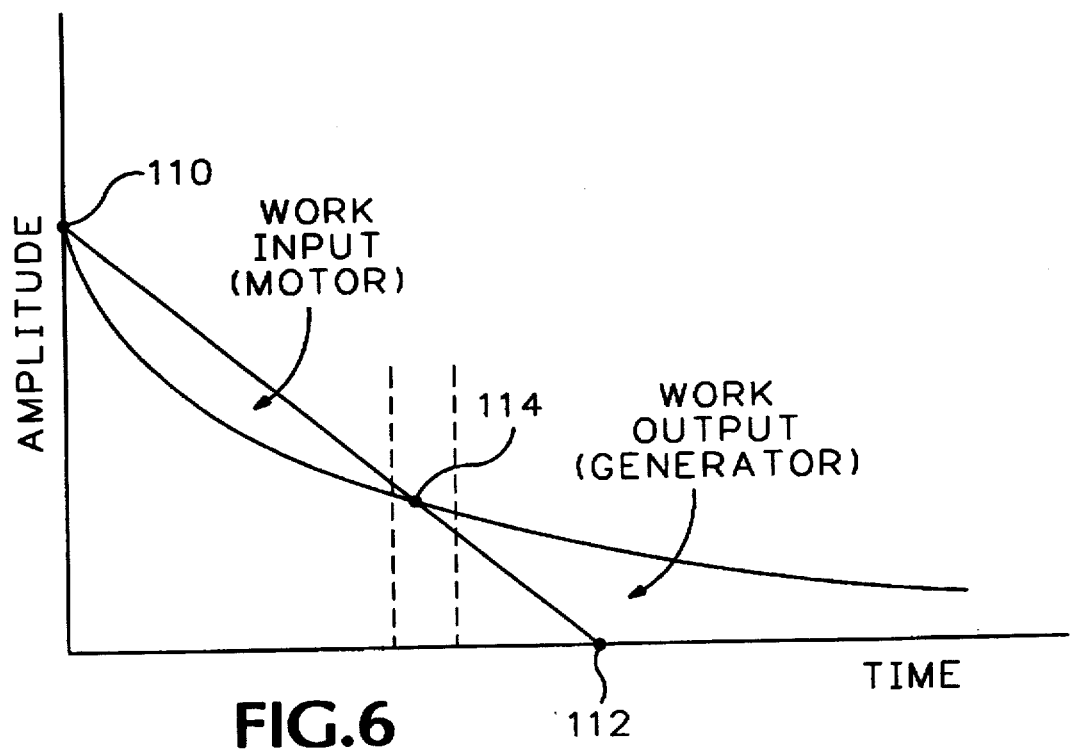
FIG. 6 is a graph of the amplitude of the current in a power cable connected to a motor versus time when the current supplied to the motor is decreased using a variable frequency drive.

Referring to FIG. 6, the operation of variable frequency drives includes a principle that is not well understood. When ramping down the variable frequency drive the amplitude of the current level is decreased from point 110 to point 112. From point 110 to point 114 the drive will be putting work into the motor. Above point 114 the motor draws current and operates as a motor. From point 114 to point 112 the motor operates as a generator producing an output current. However, there will be a finite time around point 114 during which the motor will not generate or draw current. During this time the current level will be zero or near zero. A problem is that the electronics uses the current in the cable 24 to power the microcontroller 100. During the time around point 114 there is little or no current in the power cable 24 so there will be no power to operate the microcontroller 100. During this time the microcontroller will not function properly and may indicate false alarm conditions. Capacitor C8 stores sufficient charge so that if the current level drops to zero for a limited time period a fault condition will not be indicated. The preferred time period is 2 seconds. This eliminates the problem associated with zero current times when ramping the motor. In addition, the measuring circuit may also include an override switch (not shown) to selectively activate and deactivate the auto learn function.

| Table of Component Values | | |
|---|---|---|
| Capacitor | Magnitude | Voltage Rating |
| C1 | 47 µF | 50 V |
| C2 | 10 µF | 6.3 V |
| C3 | 10 µF | |
| C4 | 20 pF | |
| C5 | 20 pF | |
| C6 | 0.022 µF | |
| C7 | 0.1 µF | |
| C8 | 4.7 µF | 6.3 V |

| Diode | Type | |
|---|---|---|
| D1 | DB104 | |
| D2 | LED | |
| D3 | 1N4756A | |
| D4 | 1N4756A | |
| D5 | LM385 | |
| D6 | LM385 | |

| Transistor | Type | |
|---|---|---|
| Q3 | 4206A | |
| Q4 | 4206A | |
| Q5 | 2N4124 | |

| Resistor | Magnitude | Tolerance | Power |
|---|---|---|---|
| R1 | 470Ω | | 1W |
| R3 | 220KΩ | | |
| R4 | 28.0KΩ | 1% | |
| R6 | 100KΩ | | |
| R7 | 1MΩ | | |
| R8 | 220KΩ | | |
| R9 | 1KΩ | | |
| R10 | 121KΩ | 1% | |
| R11 | 221KΩ | 1% | |
| R12 | 20KΩ | 1% | |

-continued

Table of Component Values

| R13 | 221KΩ |
| R14 | 47KΩ |

Other

| Y1 | crystal oscillator 131,072 Hz |
| Microcontroller | PIC162C84 (available from Microchip) |

While the aforementioned description has been discussed primarily in relation to current levels, it is to be understood that the use of voltage levels would work equally as well. Further, it is equally within the scope of the present invention to obtain a signal indicative of either the frequency or the amplitude of the signal in the power cable, from which is obtained the other of the frequency or amplitude The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A measuring system comprising:
   (a) a sensor linked with a power cable to produce a first signal in response to the presence of at least one of a sensed current and a sensed voltage within said power cable;
   (b) a measuring circuit electrically connected to said sensor to produce a second signal in response to said first signal representative of the magnitude of at least one of said sensed current and said sensed voltage within said power cable, and produce a third signal in response to said first signal representative of a sensed frequency of at least one of said sensed current and said sensed voltage within said power cable;
   (c) said measuring circuit including a model of predetermined relationships between a plurality of reference frequencies and a reference amplitude for each of said reference frequencies for at least one of said sensed voltage and said sensed current of said power cable; and
   (d) wherein said measuring circuit compares said second signal and said third signal to said model to produce a resultant signal indicative of an alarm condition.

2. The measuring system of claim 1 wherein said sensor includes a transformer magnetically linked with said power cable to produce said first signal in response to the presence of said sensed current within said power cable.

3. The measuring system of claim 1 wherein said sensor includes an electrical conductor electrically attached to said power cable to produce said first signal in response to said sensed voltage within said power cable.

4. The measuring system of claim 1 wherein said model includes a plurality of frequency bands and an associated amplitude value for each of said frequency bands.

5. The measuring system of claim 4 wherein each of said associated amplitude values for said model is determined during operation of said measuring system.

6. The measuring system of claim 5 wherein each of said associated amplitude values for said model is changed during operation of said measuring system according to the following criteria:
   (a) if said resultant signal is indicative of an alarm condition then said associated amplitude value is not changed;
   (b) said associated amplitude value is updated with said second signal if said second signal is greater than a respective one of said associated amplitude values; and
   (c) said associated amplitude value is updated with said second signal if said second signal is less than said respective one of said associated amplitude values by at least a predetermined percentage thereof.

7. A measuring system comprising:
   (a) a sensor linked with a power cable to produce a first signal in response to the presence of at least one of a sensed current and a sensed voltage within said power cable;
   (b) a measuring circuit electrically connected to said sensor to produce a second signal in response to said first signal representative of the magnitude of at least one of said sensed current and said sensed voltage within said power cable, and produce a third signal in response to said first signal representative of a sensed frequency of at least one of said sensed current and said sensed voltage within said power cable;
   (c) said measuring circuit including a model of predetermined relationships between a plurality of reference frequencies and a reference amplitude for each of said reference frequencies for at least one of said sensed voltage and said sensed current of said power cable;
   (d) said model including a plurality of frequency bands and an associated amplitude value for each of said frequency bands;
   (e) each of said associated amplitude values for said model being determined during operation of said measuring system;
   (f) each of said associated amplitude values for said model being changed during operation of said measuring system according to the following criteria:
      (i) if said resultant signal is indicative of an alarm condition then said associated amplitude value is not changed;
      (ii) said associated amplitude value is updated with said second signal if said second signal is greater than a respective one of said associated amplitude values;
      (iii) said associated amplitude value is updated with said second signal if said second signal is less than a predetermined percentage change of said respective one of said associated amplitude values; and
   (g) wherein said measuring circuit compares said second signal and said third signal to said model to produce a resultant signal indicative of an alarm condition.

* * * * *